(12) United States Patent
Chung et al.

(10) Patent No.: US 8,345,207 B2
(45) Date of Patent: Jan. 1, 2013

(54) THIN FILM TRANSISTOR ARRAY SUBSTRATE AND LIQUID CRYSTAL DISPLAY DEVICE

(75) Inventors: Techen Chung, KunShan (CN); Chiate Liao, KunShan (CN); Xiangjian Kong, KunShan (CN); Jiahao Lu, KunShan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 105 days.

(21) Appl. No.: 13/078,398

(22) Filed: Apr. 1, 2011

(65) Prior Publication Data

US 2012/0162558 A1 Jun. 28, 2012

(51) Int. Cl.
*G02F 1/1345* (2006.01)
(52) U.S. Cl. ........................................ 349/141; 349/139
(58) Field of Classification Search .................. 349/139, 349/141
See application file for complete search history.

(56) References Cited

U.S. PATENT DOCUMENTS 6,707,524 B2 * 3/2004 Kim et al. ..................... 349/141

* cited by examiner

*Primary Examiner* — Phu Vu
(74) *Attorney, Agent, or Firm* — Staas & Halsey LLP (57) ABSTRACT

A thin film transistor array substrate includes pixel regions, each comprising first, second and third transparent electrodes, which are electrically isolated, wherein the second transparent electrode comprises strip-like second electrode portions electrically connected to one another, and the third transparent electrode comprises strip-like third electrode portions electrically connected to one another, the positions of the strip-like third electrode portions corresponding to those of the strip-like second electrode portions, and wherein the strip-like third electrode portions have a width less than that of the strip-like second electrode portions. When the substrate is actuated, a first horizontal electric field is formed between the first and second transparent electrodes and a second horizontal electric field is formed between the third and second transparent electrodes, so that the transmittance can be increased.

20 Claims, 5 Drawing Sheets

THIN FILM TRANSISTOR ARRAY SUBSTRATE AND LIQUID CRYSTAL DISPLAY DEVICE

CROSS-REFERENCE TO RELATED APPLICATION

This application claims priority of and incorporates by reference Chinese Patent Application No. 201010619727.X filed Dec. 28, 2010.

FIELD OF THE INVENTION

The present invention relates to field of liquid crystal display, and more particularly, to a thin film transistor array substrate and a liquid crystal display device having the thin film transistor array substrate.

BACKGROUND

In flat panel display of prior art, thin film transistor liquid crystal displays (TFT-LCDs) are dominant due to characteristics of low radiation, thin thickness and low power consumption, etc. and are widely used for various applications. Generally, when a user views the liquid crystal display from different viewing angles, the brightness of image may reduce as the viewing angle increases, resulting in limitation of viewing angle. In order to realize display with wide viewing angle, both in-plane switch (IPS) type liquid crystal display panel and fringe field switching (FFS) type liquid crystal display panel have been developed.

Figure 1:
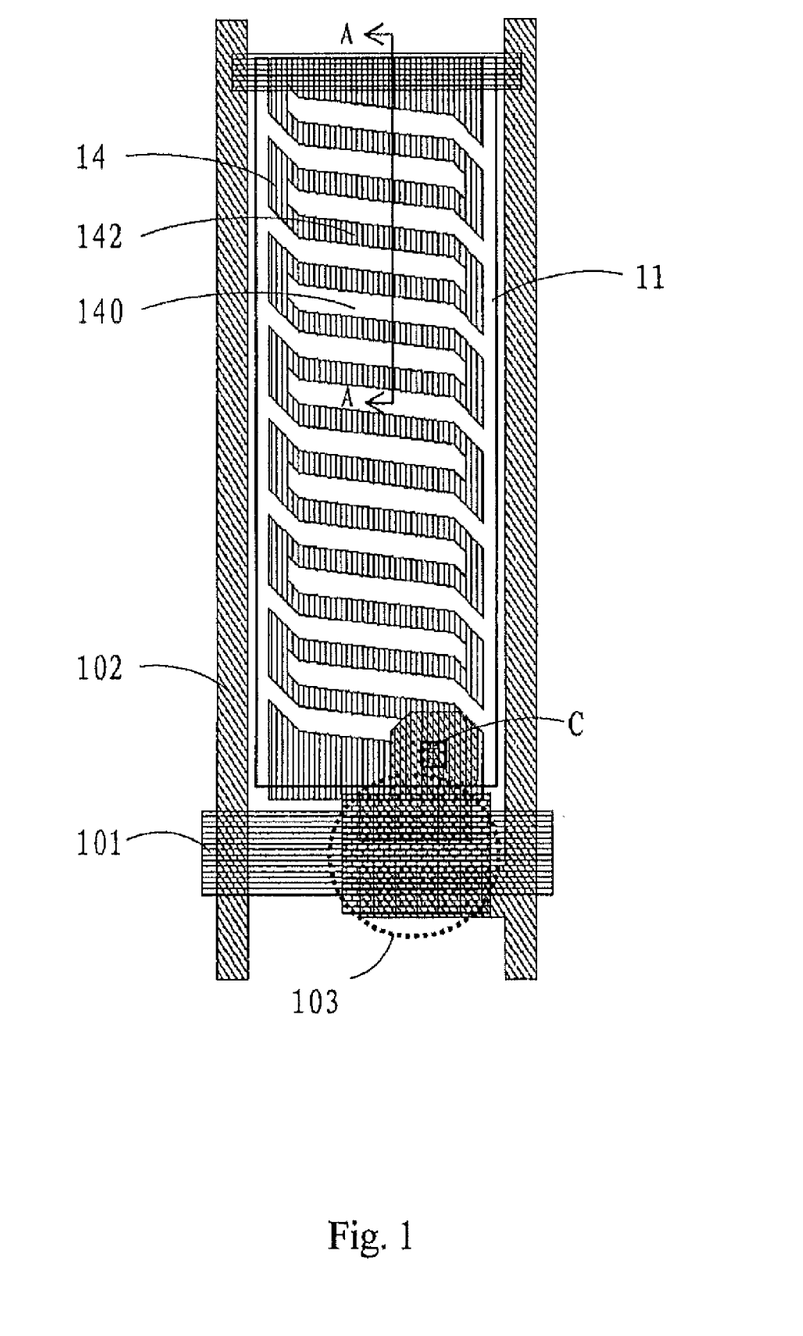
FIG. 1 is a partial plan view of a conventional FFS type liquid crystal display panel.
Figure 2:
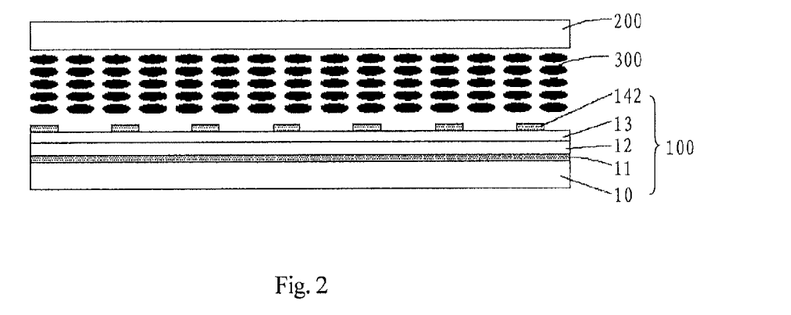
FIG. 2 is a partially sectional view along A-A line in FIG. 1.

FIG. 1 is a partial plan view of a conventional FFS type liquid crystal display panel, with a color filter substrate therein omitted for the sake of clarity. FIG. 2 is a partially sectional view along A-A line in FIG. 1, with a black matrix layer and a color filter layer disposed on the color filter substrate omitted for the sake of clarity. With reference to FIGS. 1 and 2, the conventional FFS type liquid crystal display panel comprises a thin film transistor array substrate 100, a color filter substrate 200 and a liquid crystal layer 300 sandwiched between the thin film transistor array substrate 100 and the color filter substrate 200. The thin film transistor array substrate 100 comprises a transparent substrate 10, and a plurality of scanning lines 101 and data lines 102 formed on the transparent substrate 10, with the plurality of scanning lines 101 and data lines 102 crosswise defining a plurality of pixel regions. Each pixel region comprises a first transparent electrode 11 located on a lower layer and a second transparent electrode 14 located on an upper layer, the second transparent electrode 14 being provided as strips. The first transparent electrode 11 is a common electrode 11, and the second transparent electrode 14 is a pixel electrode 14. Each pixel region further comprises a thin film transistor 103 for controlling the pixel electrode 14. The pixel electrode 14 comprises a plurality of strip-like slots 140 and a plurality of strip-like pixel electrode portions 142 formed by means of the plurality of strip-like slots 140 and electrically connected to one another. There is a gate insulation layer 12 and a passivation layer 13 isolated between the pixel electrode 14 and the common electrode 11. A gate electrode of the thin film transistor 103 is a portion of the corresponding scanning line 101 or is electrically connected with the corresponding scanning line 101, a source electrode of the thin film transistor 103 is electrically connected with the corresponding data line 102, and a drain electrode of the thin film transistor 103 is electrically connected with the pixel electrode 14 via a through hole C located on the passivation layer 13.

In order to decrease driving voltage of the FFS type LCD panel and increase response speed of liquid crystal molecules, the liquid crystal layer 300 in the FFS type LCD panel often employs anisotropic liquid crystal molecules with positive dielectric constant, however, there is a drawback of low transmittance in the conventional FFS type LCD panel.

The FFS type LCD panel uses the strip-like pixel electrode portion 142 of the pixel electrode 14 located on the upper layer and the common electrode 11 located on the lower layer to form a fringe electric field, with the horizontal component of the fringe electric field being highest at the edge of the strip-like pixel electrode portion 142. In addition, it is possible for the liquid crystal molecules at the edge of the strip-like pixel electrode portion 142 to rotate in the plane parallel to the transparent substrate 10 since the anisotropic liquid crystal molecules with positive dielectric constant are prone to rotate in a direction parallel to the electric field under the action of the electric field. The liquid crystal molecules in the region between the strip-like pixel electrode portions 142 are under a slightly weaker vertical component but a higher horizontal component of the electric field than the liquid crystal molecules in the region above the strip-like pixel electrode portions 142. Moreover, the elastic force from rotation of liquid crystal molecules also drives the liquid crystal molecules to rotate in the plane parallel to the transparent substrate 10. Consequently, there is also a relatively high transmittance in the region of the FFS type liquid crystal display panel between the strip-like pixel electrode portions 142. However, the electric field has a relatively high vertical component above the strip-like pixel electrode portions 142, but the horizontal components of the electric field applied are almost counteracted, and therefore, the liquid crystal molecules above the strip-like pixel electrode portions 142 hardly rotate in the plane parallel to the transparent substrate 10, but only rotate in the plane perpendicular to the transparent substrate 10, that is, stand up inclinedly, resulting in lower transmittance right above the strip-like pixel electrode portion 142 of the pixel electrode 14.

Figure 3:
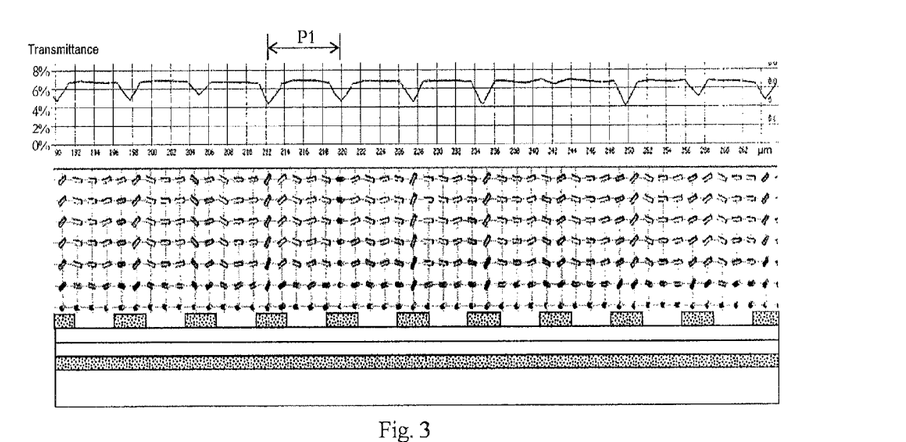
FIG. 3 is a simulation effect view of transmittance of the FFS type LCD panel shown in FIG. 2.

FIG. 3 is a simulation effect view of transmittance of the FFS type LCD panel shown in FIG. 2. As shown in FIG. 3, the region right above the strip-like pixel electrode portion 142 of the pixel electrode 14 is under a relatively weak horizontal component of electric field, and the liquid crystal molecules, under the action of the relatively weak horizontal component of electric field, have relatively small twist angle, resulting in lower transmittance in these regions, and thus having an influence on the increase of transmittance of the whole FFS type LCD panel.

In the case that the first transparent electrode 11 located on the lower layer is a pixel electrode and the second transparent electrode 14 located on the upper layer is a common electrode, there is still a problem of lower transmittance corresponding to the region right above the second transparent electrode 14.

SUMMARY

It is an object of the present invention to provide a thin film transistor array substrate and a liquid crystal display device having the thin film transistor array substrate, which are able to increase the transmittance.

In one aspect, the present invention provides a thin film transistor array substrate, which comprises a transparent substrate and a plurality of scanning lines and data lines formed on the transparent substrate, the plurality of scanning lines and data lines crosswise defining a plurality of pixel regions. Each pixel region comprises a first transparent electrode, a second transparent electrode and a third transparent electrode, which are electrically isolated, wherein the second transparent electrode comprises a plurality of strip-like second electrode portions electrically connected to one another, and the third transparent electrode comprises a plurality of strip-like third electrode portions electrically connected to one another, the positions of the strip-like third electrode portions corresponding to those of the strip-like second electrode portions, and wherein the strip-like third electrode portions have a width less than that of the strip-like second electrode portions. When the thin film transistor array substrate is actuated, a first horizontal electric field is formed between the first transparent electrode and the second transparent electrode, and a second horizontal electric field is formed between the third transparent electrode and the second transparent electrode.

Preferably, the strip-like third electrode portions and the strip-like second electrode portions are overlapped in their central positions along the normal direction of the substrate.

In another aspect, the present invention also provides a liquid crystal display device, which comprises a LCD panel and a driving circuit connected to the LCD panel, wherein the LCD panel comprises the thin film transistor array substrate as described above, an opposed substrate and a liquid crystal layer sandwiched between the thin film transistor array substrate and the opposed substrate.

According to the present invention, the thin film transistor array substrate is additionally provided with a strip-like arranged third transparent electrode, the positions of the strip-like third electrode portions of the third transparent electrode corresponding to those of the second strip electrode portions of the second transparent electrode, and the strip-like third electrode portions having a width less than that of the strip-like second electrode portions. Therefore, when the thin film transistor array substrate is actuated, a first horizontal electric field may be formed between the first transparent electrode and the second transparent electrode and a second horizontal electric field may be formed between the third transparent electrode and the second transparent electrode, and the liquid crystal molecules in the liquid crystal layer may be under the combined action of both the first horizontal electric field and the second horizontal electric field. Since the second horizontal electric field is present in the region where the first horizontal electric field is weaker, the electric intensity of that region is enhanced and the phenomenon of low transmittance right above the strip-like second electrode portions of the second transparent electrode is weakened, so that the LCD panel of the present invention reduces the region of lower transmittance of the conventional LCD panel. Moreover, according to the present invention, the horizontal distance between the strip-like second electrode portions of the second transparent electrode may be designed to be much larger than that of the conventional FFS type LCD panel, so that the number of the strip-like second electrode portions of the second transparent electrode within each pixel region of the present invention is less than that of the conventional LCD panel, and the transmittance of the LCD panel is entirely increased in a large degree.

Other aspects and features of the present invention will become apparent with reference to the accompanying drawings. But it is understood that the accompanying drawings are only designed for the purpose of explanation, but not for limitation of the scope of the present invention which is defined by the appended claims. It is also understood that the drawings are not necessarily drawn to scale, but only attempt to conceptually explain the structures and flows described herein.

DETAILED DESCRIPTION OF EMBODIMENTS

As used herein, the terms for explanation of the present invention should be interpreted as follows, unless otherwise indicated.

"Horizontal" and "horizontal direction" indicate the direction parallel to the plane where the substrate is located, and "vertical direction" and "normal direction" indicate the direction perpendicular to the plane where the substrate is located.

In order to make the objects, features and advantages described above more apparent, the embodiments of the present invention will be described in detail in combination with the accompanying drawings.

It should be noted that the drawings of the present invention only illustrate the structural features relative to the inventive aspects of the present invention but cancel other structural features.

A liquid crystal display device of the present invention comprises a LCD panel and a driving circuit (not shown) connected to the LCD panel.

First Embodiment

Figure 4:
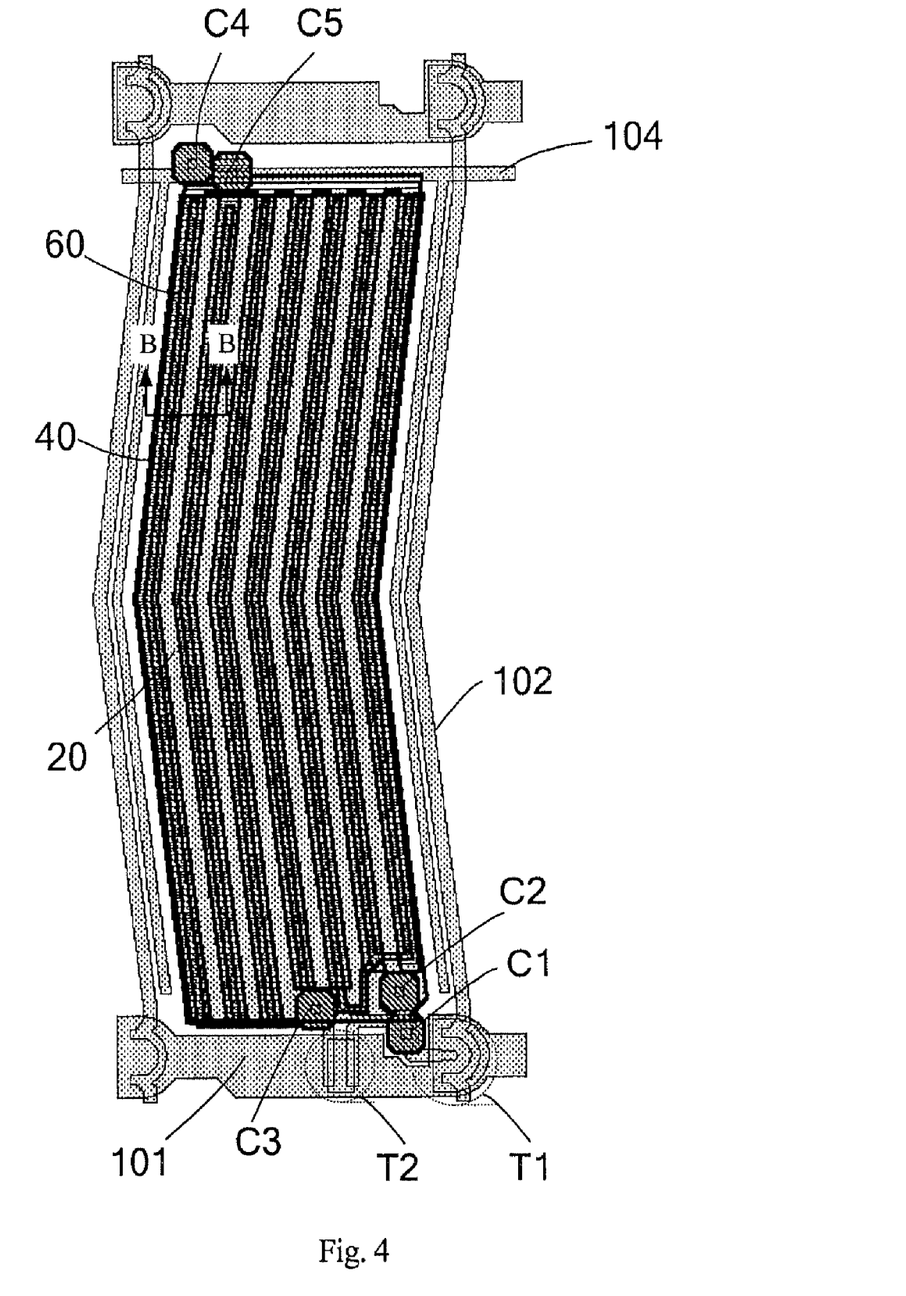
FIG. 4 is a partial plan view of a LCD panel according to a first embodiment of the present invention.
Figure 5:
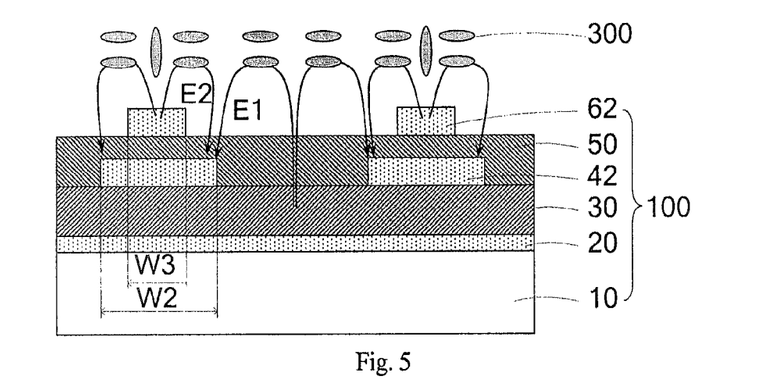
FIG. 5 is a partially sectional view along B-B line in FIG. 4.

FIG. 4 is a partial plan view of a LCD panel according to a first embodiment of the present invention, with an opposed substrate thereof omitted for the sake of clarity, and FIG. 5 is a partially sectional view along B-B line in FIG. 4. With reference to FIGS. 4 and 5, the LCD panel of the present invention comprises a thin film transistor array substrate 100, an opposed substrate (not shown) and a liquid crystal layer 300 sandwiched between the thin film transistor array substrate 100 and the opposed substrate. The thin film transistor array substrate 100 comprises a transparent substrate 10 and a plurality of scanning lines 101, data lines 102 and common electrode lines 104 formed on the transparent substrate 10, with the plurality of scanning lines 101 and data lines 102 crosswise defining a plurality of pixel regions.

Each pixel region comprises a first transparent electrode 20, a second transparent electrode 40 and a third transparent electrode 60, which are electrically isolated. The layer where the second transparent electrode 40 is located is between the layers where first transparent electrode 20 and the third transparent electrode 60 are located. In this embodiment, the first transparent electrode 20 of each pixel region is configured as a whole sheet within the pixel region, and the second transparent electrode 40 and the third transparent electrode 60 are configured as strips within the pixel region. The second transparent electrode 40 comprises a plurality of strip-like second electrode portions electrically connected to one another, and the third transparent electrode 60 comprises a plurality of strip-like third electrode portions 62 electrically connected to one another, the positions of the strip-like third electrode portions 62 corresponding to those of the strip-like second electrode portions 42, that is, the strip-like third electrode portions 62 being configured to overlap with the strip-like second electrode portions 42 in the normal direction of the substrate. Preferably, the projections of the strip-like third electrode portions 62 in the normal direction of the strip-like second electrode portions 42 are in the central positions of the strip-like second electrode portions 42, that is, the strip-like third electrode portions 62 and the strip-like second electrode portions 42 are overlapped in their central positions along the normal direction of the substrate. Moreover, the strip-like third electrode portions 62 have a width W3 less than the width W2 of the strip-like second electrode portions 42, for example, the width W3 of the strip-like third electrode portions 62 is set to be 3 μM, and the width W2 of the strip-like second electrode portions 42 is set to be 9 μM.

In this embodiment, preferably, the first transparent electrode 20 is a first pixel electrode 20, the second transparent electrode 40 is a common electrode 40, and the third transparent electrode 60 is a second pixel electrode 60. Correspondingly, the strip-like second electrode portions 42 are strip-like common electrode portions 42, and the strip-like third electrode portions 62 are strip-like second pixel electrode portions 62. Certainly, the present invention is not limited thereto, and in other embodiments of the present invention, the first transparent electrode 20 can also be a first common electrode, the third transparent electrode 60 can be a second common electrode, and the second transparent electrode 40 can be a pixel electrode.

The first pixel electrode 20, the second pixel electrode 60 and the common electrode 40 are all made of transparent conducting materials, for example, all made of ITO (Indium Tin Oxide) or IZO (Indium Zinc Oxide) and the like. There is a gate insulation layer 30 isolated between the first pixel electrode 20 and the common electrode 40 and a passivation layer 50 isolated between the common electrode 40 and the second pixel electrode 60.

Each pixel region further comprises a first thin film transistor T1 for controlling the first pixel electrode 20 and a second thin film transistor T2 for controlling the second pixel electrode 60. In this embodiment, a source electrode of the first thin film transistor T1 is connected to the corresponding data line 102, a source electrode of the second thin film transistor T2 is electrically connected with a drain electrode of the first thin film transistor T1, and the second thin film transistor T2 has a channel width-to-length ratio less than that of the first thin film transistor T1. Certainly, the present invention is not limited thereto, and in other embodiments of the present invention, one of the source electrodes of the first thin film transistor T1 and the second thin film transistor T2 can be connected to the data line 102, and the other thereof can be connected to a separately configured circuit (not shown), which can also achieve the objects of the present invention without departing from the essences of technical schemes of the present invention.

A first through hole C1, a third through hole C3 and a fourth through hole C4 which penetrate through the passivation layer 50 are respectively provided on the passivation layer 50, and a second through hole C2 and a fifth through hole C5 which penetrate through both the passivation layer 50 and the gate insulation layer 30 are provided on the passivation layer 50 and the gate insulation layer 30. The first pixel electrode 20 is electrically connected with the drain electrode of the first thin film transistor T1 via the first through hole C1 and the second through hole C2 and by means of a transparent conducting connection portion on the layer where the second pixel electrode 60 is located, the second pixel electrode 60 is electrically connected with a drain source of the second thin film transistor T2 via the third through hole C3, and the common electrode 40 is electrically connected with the common electrode line 104 via the fourth through hole C4 and the fifth through hole C5 and by means of a transparent conducting connection portion on the layer where the second pixel electrode 60 is located.

As shown in FIG. 5, during the work of the LCD panel, a common voltage signal input to the common electrode line 104 via the driving circuit is applied to the common electrode 40 via the fourth through hole C4 and the fifth through hole C5. When the scanning lines 101 are in high level, the first thin film transistor is turned on, and the source and drain electrodes of the first thin film transistor T1 are connected, a data voltage signal input to the data line 102 via the driving circuit is applied to the drain electrode via the source electrode of the first thin film transistor T1, and then is applied to the first pixel electrode 20 via the first through hole C1 and the second through hole C2. Meanwhile, since the source electrode of the second thin film transistor T2 is electrically connected with the drain electrode of the first thin film transistor T1, the second thin film transistor T2 is also turned on, and the source and drain electrodes of the second thin film transistor T2 are connected, the data voltage signal is applied to the drain electrode via the source electrode of the second thin film transistor T2, and then is applied to the second pixel electrode 60 via the third through hole C3. Since the second thin film transistor T2 has a channel width-to-length ratio less than that of the first thin film transistor T1, which results in undercharge of the second pixel electrode 60, thus the absolute value of voltage on the first pixel electrode 20 is larger than that on the second pixel electrode 60. For a positive pixel region as shown in FIG. 5, the voltages on both the first pixel electrode 20 and the second pixel electrode 60 are larger than the voltage on the common electrode 40, and the voltage on the first pixel electrode 20 is larger than the voltage on the second pixel electrode 60, so that a first horizontal electric field E1 is formed between the first pixel electrode 20 and the common electrode 40, and a second horizontal electric field E2 is formed between the second pixel electrode 60 and the common electrode 40. The electric field line generated by the first horizontal electric field E1 is sent out from the first pixel electrode 20 on the lower layer and is received by the common electrode 40 on the intermediate layer, and the electric field line generated by the second horizontal electric field E2 is sent out from the second pixel electrode 60 on the upper layer and is received by the common electrode 40 on the intermediate layer, and moreover, the electric intensity of the first horizontal electric field E1 formed is larger than that of the second horizontal electric field E2. Similarly, for a negative pixel region, the voltages on both the first pixel electrode 20 and the second pixel electrode 60 are less than the voltage on the common electrode 40, and the voltage on the first pixel electrode 20 is less than the voltage on the second pixel electrode 60, so that a first horizontal electric field E1 is formed between the first pixel electrode 20 and the common electrode 40, and a second horizontal electric field E2 is formed between the second pixel electrode 60 and the common electrode 40. The electric field line generated by the first horizontal electric field E1 is sent out from the common electrode 40 on the intermediate layer and is received by the first pixel electrode 20 on the lower layer, and the electric field line generated by the second horizontal electric field E2 is sent out from the common electrode 40 on the intermediate layer and is received by the second pixel electrode 60 on the upper layer, and moreover, the electric intensity of the first horizontal electric field E1 formed is larger than that of the second horizontal electric field E2. Thus, the liquid crystal molecules in the liquid crystal layer 300 are rotated under the combined action of the first horizontal electric field E1 and the second horizontal electric field E2, so as to achieve display of various gray scales by controlling transmission flux of backlight.

Figure 6:
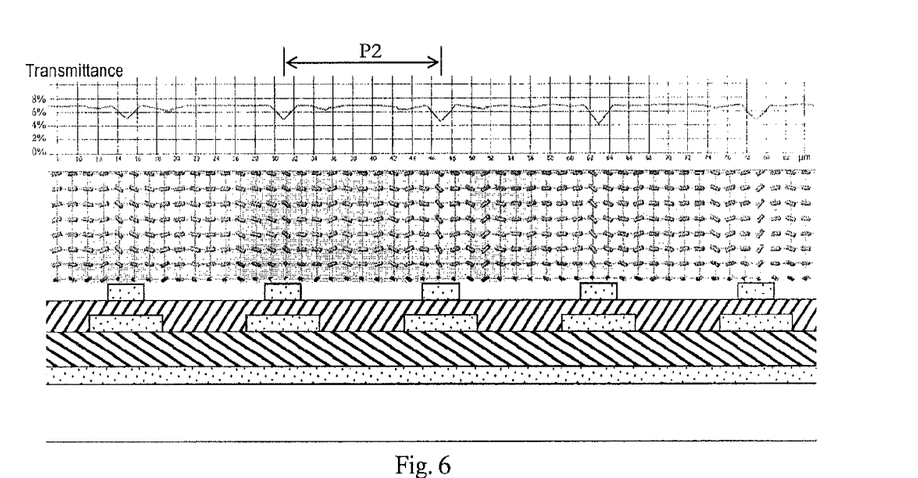
FIG. 6 is a simulation effect view of transmittance of the LCD panel shown in FIG. 5.

The thin film transistor array substrate 100 of the present invention is additionally provided with a strip-like arranged third transparent electrode 60, the positions of the strip-like third electrode portions 62 of the third transparent electrode 60 corresponding to those of the strip-like second electrode portions 42 of the second transparent electrode 40, and moreover, the strip-like third electrode portions 62 having a width W3 less than the width W2 of the strip-like second electrodes 42, that is to say, the strip-like third electrode portions 62 having a size in the horizontal direction less than that of the strip-like second electrode portions 42. As a result, when the thin film transistor array substrate 100 is actuated, a first horizontal electric field E1 may be formed between the first transparent electrode 20 and the second transparent electrode 40, and a second horizontal electric field E2 may be formed between the third transparent electrode 60 and the second transparent electrode 40. The liquid crystal molecules in the liquid crystal layer 300 may be under the combined action of both the first horizontal electric field E1 and the second horizontal electric field E2. In the conventional LCD panel as shown in FIG. 2, the liquid crystal molecules corresponding to the region right above the strip-like second transparent electrode are substantially not under the action of the horizontal component of the electric field formed between the first transparent electrode and the second transparent electrode, and therefore, the liquid crystal molecules in these regions will substantially not rotate in the plane parallel to the transparent substrate, whereas in the LCD panel shown in FIG. 5 according to the present invention, the liquid crystal molecules corresponding to the region right above the strip-like second electrode portions 42 of the second transparent electrode 40 can be under the action of the second horizontal electric field E2, with the horizontal component of the second horizontal electric field E2 highest at the edge of the strip-like third electrode portions 62 of the third transparent electrode 60. Therefore, the liquid crystal molecules corresponding to the region right above the portion of strip-like second electrode portions 42 of the second transparent electrode 40, not overlapped with the strip-like third electrode portions 62 of the third transparent electrode 60, are possibly under the action of the horizontal component of the higher second horizontal electric field E2, so that it is possible for the liquid crystal molecules in these regions to rotate in the plane parallel to the transparent substrate 10. Since the strip-like third electrode portions 62 of the third transparent electrode 60 are additionally provided on the positions corresponding to the strip-like second electrode portions 42 of the second transparent electrode 40 according to the present invention, compared to FIG. 2 in which the liquid crystal molecules corresponding to the entire region right above the strip-like second transparent electrode are substantially not under the action of the horizontal component of the electric field, in the region of the LCD panel of the present invention right above the strip-like second electrode portions 42 of the second transparent electrode 40, the liquid crystal molecules in a partial region therein can be under the action of the horizontal component of the second horizontal electric field E2 and rotate in the plane parallel to the transparent substrate 10, so that the distance between the strip-like second electrode portions 42 of the second transparent electrode 40 of the present invention may be designed to be much larger relative to the conventional LCD panel shown in FIG. 2, and so that, on the whole, the number of the strip-like second electrode portions 42 of the second transparent electrode 40 within each pixel region of the present invention is less than that of the conventional LCD panel shown in FIG. 2, and thus the number of the regions with low transmittance right above the strip-like second electrode portions 42 of the second transparent electrode 40 are also less than that of the conventional LCD panel shown in FIG. 2, and therefore the transmittance of the LCD panel of the present invention is entirely increased in a large degree. FIG. 6 is a simulation effect view of transmittance of the LCD panel according to the first embodiment of the present invention shown in FIG. 5. FIGS. 6 and 3 are performed in the same simulated conditions. It can be obviously seen from comparison between FIGS. 6 and 3, in the conventional LCD panel shown in FIG. 3, the space P1 between its two adjacent regions with lower transmittance is approximately 7-8 μm (micron), while in the LCD panel of the present invention shown in FIG. 6, the space P2 between its two adjacent regions with lower transmittance is approximately 16 μm (micron), so that the space P2 between its two adjacent regions with lower transmittance for the LCD panel of the present invention is largely increased, and moreover the regions with lower transmittance of the LCD panel of the present invention is greatly reduced, so that the transmittance of the LCD panel of the present invention is entirely increased in a large degree compared to the conventional LCD panel shown in FIG. 3.

Figure 7:
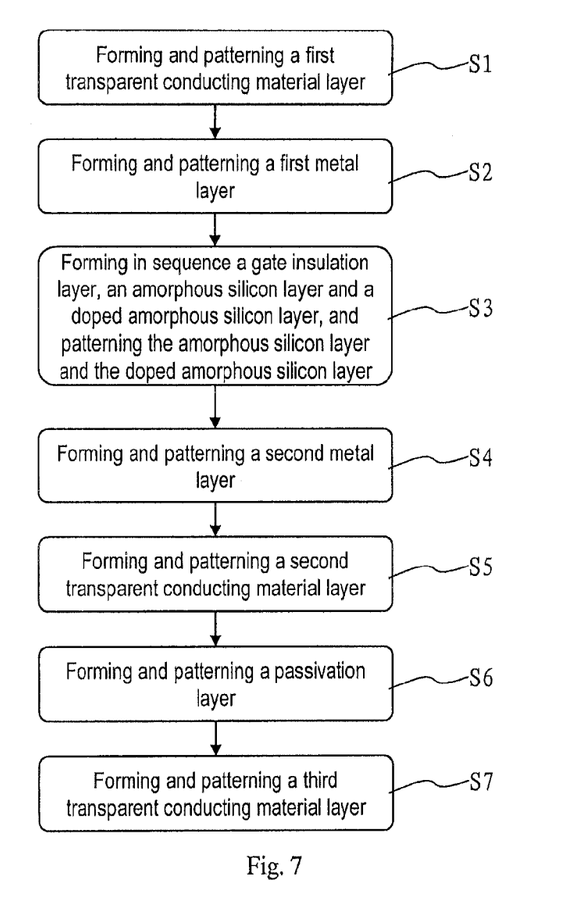
FIG. 7 is a flow diagram for manufacturing a thin film transistor array substrate according to the first embodiment of the present invention.

As shown in FIG. 7, the thin film transistor array substrate 100 according to an embodiment of the present invention may be manufactured using the following seven photo-masking procedures.

In step S1, a first photo-masking procedure is employed to form and pattern a first transparent conducting material layer.

Specifically, a first transparent conducting material layer and a first photoresist layer are formed in sequence on the transparent substrate 10 and the first photoresist layer is exposed and developed by a first photo-masking pattern so as to form a first photoresist layer pattern, and then the first transparent conducting material layer is etched using the first photoresist layer pattern as mask to realize patterning, so as to form a first pixel electrode 20 by the patterned first transparent conducting material layer, and later, the first photoresist layer is removed.

In step S2, a second photo-masking procedure is employed to form and pattern a first metal layer.

Specifically, a first metal layer and a second photoresist layer are formed in sequence on the transparent substrate 10 having the patterned first transparent conducting material layer, and the second photoresist layer is exposed and developed by a second photo-masking pattern so as to form a second photoresist layer pattern, and then the first metal layer is etched using the second photoresist layer pattern as mask to realize patterning, so as to form scanning lines 101, common electrode lines 104, gate electrodes of the first thin film transistor T1 and the second thin film transistor T2, and later, the second photoresist layer is removed.

In step S3, a third photo-masking procedure is employed to in sequence form a gate insulation layer, an amorphous silicon layer and a doped amorphous silicon layer, and pattern the doped amorphous silicon layer and the amorphous silicon layer.

Specifically, a gate insulation layer 30, an amorphous silicon layer, a doped amorphous silicon layer and a third photoresist layer are formed in sequence on the transparent substrate 10 with the second photo-masking pattern formed thereon, and the third photoresist layer is exposed and developed by a third photo-masking pattern so as to form a third photoresist layer pattern, and then the doped amorphous silicon layer and the amorphous silicon layer are etched using the third photoresist layer pattern as mask to realize patterning, so as to form semiconductor layers of the first thin film transistor T1 and the second thin film transistor T2, and later, the third photoresist layer is removed.

In step S4, a fourth photo-masking procedure is employed to form and pattern a second metal layer.

Specifically, a second metal layer and a fourth photoresist layer are formed in sequence on the transparent substrate 10 with the third photo-masking pattern formed thereon, and the fourth photoresist layer is exposed and developed by a fourth photo-masking pattern so as to form a fourth photoresist layer pattern, and then the second metal layer is etched using the fourth photoresist layer pattern as mask to realize patterning, so as to form data lines 102, source and drain electrodes of the first thin film transistor T1 and the second thin film transistor T2 by the patterned second metal layer, and later, the fourth photoresist layer is removed.

In step 5, a fifth photo-masking procedure is employed to form and pattern a second transparent conducting material layer.

Specifically, a second transparent conducting material layer and a fifth photoresist layer are formed in sequence on the transparent substrate 10 with the fourth photo-masking pattern formed thereon, and the fifth photoresist layer is exposed and developed by a fifth photo-masking pattern so as to form a fifth photoresist layer pattern, and then the second transparent conducting material layer is etched using the fifth photoresist layer pattern as mask to realize patterning, so as to form a common electrode 40 comprising a plurality of strip-like common electrode portions 42 electrically connected to one another, and later, the fifth photoresist layer is removed.

In step S6, a sixth photo-masking procedure is employed to form and pattern a passivation layer.

Specifically, a passivation layer and a sixth photoresist layer are formed in sequence on the transparent substrate 10 with the fifth photo-masking pattern formed thereon, and the sixth photoresist layer is exposed and developed by a sixth photo-masking pattern so as to form a sixth photoresist layer pattern, and then the passivation layer 50 and the gate insulation layer 30 below the passivation layer 50 are etched using the sixth photoresist layer as mask to realize patterning, so as to form first to fifth through holes C1-C5, wherein the first through hole C1 only penetrates through the passivation layer 50 so as to expose a portion of the drain electrode of the first thin film transistor T1, the third through hole C3 only penetrates through the passivation layer 50 so as to expose a portion of the drain electrode of the second thin film transistor T2, the fourth through hole C4 also only penetrates through the passivation layer 50 so as to expose a portion of the common electrode 40, the second through hole penetrates through both the passivation layer 50 and the gate insulation layer 30 so as to expose a portion of the first pixel electrode 20, and the fifth through hole C5 also penetrate through both the passivation layer 50 and the gate insulation layer 30 so as to expose a portion of the common electrode line 104, and later, the sixth photoresist layer is removed.

In step S7, a seventh photo-masking procedure is employed to form and pattern a third transparent conducting material layer.

Specifically, a third transparent conducting material layer and a seventh photoresist layer are formed in sequence on the transparent substrate 10 with the sixth photo-masking pattern formed thereon, and the seventh photoresist layer is exposed and developed by a seventh photo-masking pattern so as to form a seventh photoresist layer pattern, and then the third transparent conducting material layer is etched using the seventh photoresist layer pattern as mask to realize patterning, so as to form a second pixel electrode 60 comprising a plurality of strip-like second pixel portions 62 electrically connected to one another, and meanwhile, form a transparent conducting connection portion between the first through hole C1 and the second through hole C2, and a transparent conducting connection portion between the fourth through hole C4 and the fifth through hole C5, wherein the second pixel electrode 60 covers the third through hole C3 and is electrically connected with the drain electrode of the second thin film transistor T2 via the third through hole C3, the first pixel electrode 20 is electrically connected with the drain electrode of the first thin film transistor T1 via the first through hole C1, the second through hole C2 and the transparent conducting connection portion between the first through hole C1 and the second through hole C2, and the common electrode 40 is electrically connected with the common electrode line 104 via the fourth through hole C4, the fifth through hole C5 and the transparent conducting connection portion between the fourth through hole C4 and the fifth through hole C5.

After the above-mentioned steps S1-S7, the thin film transistor array substrate 100 of the present invention is formed.

In the above-mentioned seven photo-masking procedures for the thin film transistor array substrate, the first photo-masking procedure and the second photo-masking procedure can be interchangeable, that is, the first metal layer pattern is firstly formed and then the first transparent conducting material layer pattern is formed. Likewise, the fourth photo-masking procedure and the fifth photo-masking procedure can also be interchangeable, that is, the second transparent conducting material layer pattern is firstly formed, and then the second metal layer pattern is formed. These manufacturing methods are similar to the above and will not be not described herein any more.

Second Embodiment

Figure 8:
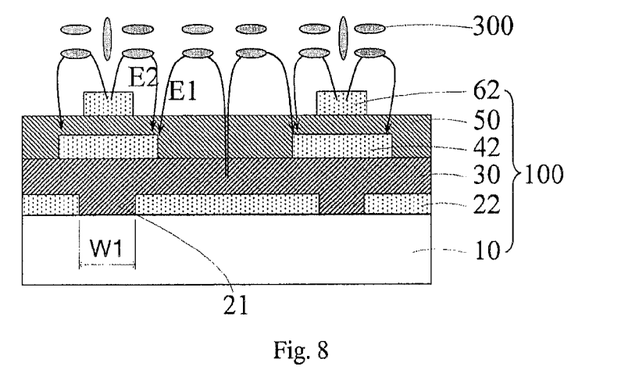
FIG. 8 is a partially sectional view for a LCD panel according to a second embodiment of the present invention.

As shown in FIG. 8, the same parts between the second and first embodiments will not be described herein any more, and the differences therebetween lie in that the first pixel electrode 20 in the second embodiment is not configured as a whole sheet but as strips within the pixel region, and strip-like slots 21 are provided in the positions of the first transparent electrode 20 of each pixel region corresponding to the strip-like second electrode portions 42 of the second transparent electrode 40, the first transparent electrode 20 comprising a plurality of strip-like first electrode portions 22 formed by means of the slots 21 and electrically connected to one another. Preferably, the slots 21 are right below the strip-like second electrode portions 42, that is, the slots 21 and the strip-like second electrode portions 42 are overlapped in their central positions along the normal direction of the substrate, and preferably, the strip-like slots 201 have a width W1 less than the width W2 of the strip-like second electrode portions 42.

The second embodiment can also generate a first horizontal electric field E1 and a second horizontal electric field E2, similar to the first embodiment, and the liquid crystal molecules 300 are rotated under the combined action of the first horizontal electric field E1 and the second horizontal electric field E2, so as to achieve display of various gray scales by controlling transmission flux of backlight. The second embodiment has beneficial technical effects similar to the first embodiment.

The thin film transistor array substrate and the liquid crystal display device provided by the present invention are described above in detail, and specific examples are used herein to illustrate the principle and embodiments of the present invention, which are only used to help understanding the approaches and concepts of the present invention; meanwhile, one skilled in the prior art may make various variations of specific embodiments and scope of application based on the concepts of the present invention. In view of the foregoing, the contents of the specification should not be interpreted as limitation of the present invention whose scope is only defined by the appended claims.

What is claimed is:

1. A thin film transistor array substrate, comprising a transparent substrate and a plurality of scanning lines and data lines formed on the transparent substrate, the plurality of scanning lines and data lines crosswire defining a plurality of pixel regions, wherein each pixel region comprises a first transparent electrode, a second transparent electrode and a third transparent electrode, which are electrically isolated, the second transparent electrode comprising a plurality of strip-like second electrode portions electrically connected to one another, the third transparent electrode comprising a plurality of strip-like third electrode portions electrically connected to one another, the positions of the strip-like third electrode portions corresponding to those of the strip-like second electrode portions, and the strip-like third electrode portions having a width less than that of the strip-like second electrode portions, and wherein when the thin film transistor array substrate is actuated, a first horizontal electric field is formed between the first transparent electrode and the second transparent electrode, and a second horizontal electric field is formed between the third transparent electrode and the second transparent electrode.

2. The thin film transistor array substrate of claim 1, wherein the strip-like third electrode portions and the strip-like second electrode portions are overlapped in their central positions along the normal direction of the substrate.

3. The thin film transistor array substrate of claim 2, wherein the first transparent electrode is a first pixel electrode, the second transparent electrode is a common electrode, and the third transparent electrode is a second pixel electrode.

4. The thin film transistor array substrate of claim 2, wherein the first transparent electrode of each pixel region is configured as a whole sheet within the pixel region.

5. The thin film transistor array substrate of claim 2, wherein slots are provided in the positions of the first transparent electrode of each pixel region corresponding to the strip-like second electrode portions, and the first transparent electrode comprises a plurality of strip-like first electrode portions formed by means of the slots and electrically connected to one another, thus allowing the first pixel electrode to be configured as strips within the pixel region.

6. The thin film transistor array substrate of claim 5, wherein the slots provided on the first transparent electrode and the strip-like second electrode portions are overlapped in their central positions along the normal direction of the substrate.

7. The thin film transistor array substrate of claim 3, wherein each pixel region further comprises a first thin film transistor for controlling the first pixel electrode and a second thin film transistor for controlling the second pixel electrode.

8. The thin film transistor array substrate of claim 7, wherein a source electrode of the first thin film transistor is connected to the data line, a source electrode of the second thin film transistor is electrically connected with a drain electrode of the first thin film transistor, and the second thin film transistor has a channel width-to-length ratio less than that of the first thin film transistor.

9. The thin film transistor array substrate of claim 7, wherein one of source electrodes of the first thin film transistor and the second thin film transistor is connected to the data line, and the other thereof is connected to a separately configured circuit.

10. The thin film transistor array substrate of claim 8, wherein the layer where the second transparent electrode is located is between the layers where first transparent electrode and the third transparent electrode are located, and there is a gate insulation layer isolated between the first transparent electrode and the second transparent electrode and a passivation layer isolated between the second transparent electrode and the third transparent electrode.

11. The thin film transistor array substrate of claim 10, wherein a first through hole is provided on the passivation layer, and a second through hole is provided on both the passivation layer and the gate insulation layer, the first pixel electrode being electrically connected with the drain electrode of the first thin film transistor via the first through hole and the second through hole.

12. The thin film transistor array substrate of claim 11, wherein a third through hole is provided on the passivation layer, the second pixel electrode being electrically connected with a drain electrode of the second thin film transistor via the third through hole.

13. The thin film transistor array substrate of claim 12, wherein the common electrode lines are further formed on the transparent substrate, a fourth through hole is provided on the passivation layer, and a fifth through hole is provided on both the passivation layer and the gate insulation layer, the common electrode being electrically connected with the common electrode line via the fourth through hole and the fifth through hole.

14. A liquid crystal display device comprising a liquid crystal display panel and a driving circuit connected to the liquid crystal display panel, wherein the liquid crystal display panel comprises the thin film transistor array substrate as set forth in claim 1, an opposed substrate and a liquid crystal layer sandwiched between the thin film transistor array substrate and the opposed substrate.

15. The liquid crystal display device of claim 14, wherein the first horizontal electric field generated has an electric intensity larger than that of the second horizontal electric field.

16. The liquid crystal display device of claim 15, wherein when the liquid crystal display device is actuated, as for a positive pixel region, the voltages on both the first transparent electrode and the third transparent electrode are larger than the voltage on the second transparent electrode, and the voltage on the first transparent electrode is larger than the voltage on the third transparent electrode, and as for a negative pixel region, the voltages on both the first pixel electrode and the third transparent electrode are less than the voltage on the second transparent electrode, and the voltage on the first transparent electrode is less than the voltage on the third transparent electrode.

17. The liquid crystal display device of claim 14, wherein the strip-like third electrode portions and the strip-like second electrode portions are overlapped in their central positions along the normal direction of the substrate.

18. The liquid crystal display device of claim 17, wherein the first transparent electrode of each pixel region is configured as a whole sheet within the pixel region.

19. The liquid crystal display device of claim 17, wherein slots are provided in the positions of the first transparent electrode of each pixel region corresponding to the strip-like second electrode portions, and the first transparent electrode comprises a plurality of strip-like first electrode portions formed by means of the slots and electrically connected to one another, thus allowing the first pixel electrode to be configured as strips within the pixel region.

20. The liquid crystal display device of claim 19, wherein the slots provided on the first transparent electrode and the strip-like second electrode portions are overlapped in their central positions along the normal direction of the substrate.

* * * * *